(12) United States Patent
Weichold (10) Patent No.: US 12,149,055 B2
(45) Date of Patent: Nov. 19, 2024

(54) VOLTAGE SENSING ASSEMBLY

(71) Applicant: 3M INNOVATIVE PROPERTIES COMPANY, St. Paul, MN (US)

(72) Inventor: Jens Weichold, Erkelenz (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 17/754,519

(22) PCT Filed: Oct. 12, 2020

(86) PCT No.: PCT/IB2020/059580
§ 371 (c)(1),
(2) Date: Apr. 5, 2022

(87) PCT Pub. No.: WO2021/084355
PCT Pub. Date: May 6, 2021

(65) Prior Publication Data
US 2024/0063614 A1    Feb. 22, 2024

(30) Foreign Application Priority Data

Oct. 28, 2019    (EP) ..................................... 19205552

(51) Int. Cl.
*G01R 15/06*    (2006.01)
*H02B 13/035*   (2006.01)

(52) U.S. Cl.
CPC ......... *H02B 13/0356* (2013.01); *G01R 15/06* (2013.01)

(58) Field of Classification Search
None
See application file for complete search history.

(56) References Cited

U.S. PATENT DOCUMENTS

| | | | |
|---|---|---|---|
| 6,555,999 B1 | 4/2003 | Lindsey | |
| 8,076,925 B2 | 12/2011 | Harlev | |
| 9,347,976 B2 | 5/2016 | Mason | |
| 11,327,096 B2* | 5/2022 | van Meijl | G01R 19/0084 |
| 11,486,902 B2* | 11/2022 | Stalder | G01R 15/16 |
| 11,683,880 B2* | 6/2023 | Stollwerck | H05K 1/0254 |
| | | | 174/350 |
| 2010/0018752 A1 | 1/2010 | Emilsson | |

(Continued)

FOREIGN PATENT DOCUMENTS

| | | |
|---|---|---|
| EP | 0087267 | 12/1986 |
| EP | 3223024 | 11/2018 |

(Continued)

OTHER PUBLICATIONS

"HV Standoff Insulators Catalogue Cutsheet", Storm Power Components, [retrieved on Mar. 17, 2020], URL <http://stormpowercomponentscom/assets/content/downloads/stormpowercomponents_cut-sheet-standoff-insulators-pl.pdf>, 2017, p. 1, XP05567721.

(Continued)

*Primary Examiner* — Courtney L Smith
(74) *Attorney, Agent, or Firm* — Gregg H. Rosenblatt (57) ABSTRACT

Assembly (1) of a busbar (20), a cable termination (40) (or an insulating element (300) or a bushing (400)) and a voltage sensor (10) in a high-voltage or medium-voltage power network. The cable termination (or the insulating element or the bushing) and the voltage sensor are mechanically and electrically connected to the busbar.

5 Claims, 4 Drawing Sheets

(56) References Cited

U.S. PATENT DOCUMENTS

| | | |
|---|---|---|
| 2014/0370741 A1 | 12/2014 | Bolcato |
| 2019/0086444 A1* | 3/2019 | Gravermann .......... H05K 1/189 |
| 2020/0174042 A1* | 6/2020 | Stalder .................... H05K 1/18 |
| 2020/0278381 A1* | 9/2020 | Westkamp ............. G01R 15/06 |
| 2020/0278382 A1* | 9/2020 | Weichold ............... G01R 15/06 |

FOREIGN PATENT DOCUMENTS

| | | |
|---|---|---|
| EP | 3499246 | 6/2019 |
| WO | WO 2019-123218 | 6/2019 |
| WO | WO 2020-079622 | 4/2020 |

OTHER PUBLICATIONS

Milovac, "Sensor Technology In A Medium-Voltage Switchgear For The US Market Applications", 24th International Conference & Exhibition on Electricity Distribution (CIRED), IET Journals, 2017, vol. 2017, No. 01, pp. 432-435.

International Search Report for PCT International Application No. PCT/IB2020/059580, mailed on Dec. 23, 2020, 6 pages.

\* cited by examiner

VOLTAGE SENSING ASSEMBLY

The invention relates to voltage sensors for high-voltage or medium-voltage for distributing electrical power in national grids, and in particular to assemblies where a voltage sensor unit is connected to a busbar, e.g. in a switchgear that is insulated versus electrical ground by e.g. a cable termination, by an insulating element such as a standoff, or by a bushing, that is attached on one side to the busbar and to a grounded element on the other side.

For better control and better management of their networks, power network operators are currently upgrading their networks by adding more and more voltage sensors. Such sensors measure voltage between a power conductor and an element on electrical ground. Such sensors are often integrated into insulating elements (such as standoffs, insulators, bushings, cable terminations) which are mechanically attached to the power conductor and, on the other side, to an element on electrical ground. With such "sensorized" insulating elements a sensor can be added to the network, albeit for the cost of removing the existing insulating element and replacing it with the new, sensorized insulating element.

An example of a sensorized insulation element can be found in the European patent application EP 3 223 024 A1, in which an insulating sleeve has a receiving space for a power conductor and a cavity to receive a voltage sensor. The sleeve insulates the central conductor of the cable against the ground connection of the sensor.

Besides the cost for the new sensorized insulating element, a replacement insulating element results in waste and requires a considerable amount of labour to de-install the existing insulating element and to install the new, sensorized insulating element. A replacement is thus labour- and cost-intensive.

In a particular scenario an existing cable termination may be a candidate for replacement by a new, sensorized cable termination. Besides cost for labour and hardware, this replacement would typically require the cable to be cut, which would result in a shorter cable that may not be long enough to be connected to a busbar through the new, sensorized termination. In this case extra measures would have to be taken to provide sufficient length for a connection of the cable to the busbar, which further increases the cost of replacement.

The present disclosure attempts to address these issues. In a first aspect it provides an assembly of
  a) a busbar, such as for use in a switchgear or transformer in a high-voltage or medium-voltage power network for distributing electrical power at an elevated voltage in a national grid;
  b) a cable termination, arranged on an end portion of a high-voltage or medium-voltage power cable for distributing electrical power, the cable termination insulating a section of the end portion, wherein a power conductor of the power cable is mechanically and electrically connected to the busbar via the cable termination, and
  c) a voltage sensor, mechanically connected to the busbar and comprising a voltage divider, electrically connected between the busbar and electrical ground, for sensing the elevated voltage of the bus bar, the voltage divider comprising
    i) a high-voltage portion comprising one or more discrete impedance elements, electrically serially connected with each other and electrically connected to the busbar,
    ii) a low-voltage portion comprising one or more discrete impedance elements, serially connected between the high-voltage portion and ground, and
    iii) a signal contact, electrically arranged between the high-voltage portion and the low-voltage portion, for providing a signal voltage indicative of the elevated voltage.

Instead of replacing an existing plain cable termination by a sensorized cable termination, the cable can keep being connected and mechanically attached to the busbar, and the existing termination keeps insulating the busbar and the cable conductor on high voltage against the grounding layer of the cable on electrical ground. The voltage sensor is added to the assembly of cable, termination and busbar and is connected between busbar and ground and senses the elevated voltage of the busbar via its voltage divider. The signal contact of the voltage divider outputs the signal voltage which varies proportionally with the elevated voltage, e.g. at a frequency of about 50 Hertz.

The addition of the voltage divider facilitates an accurate sensing of the voltage of the busbar and makes removal of the cable end from the busbar for replacing the existing termination by a sensorized termination obsolete. The new assembly now consists of the cable, the termination, the busbar and the voltage sensor.

A cable termination is conventionally used to insulate an end portion of a high-voltage (HV) or medium-voltage (MV) power cable. Bodies of cable terminations for HV or MV power cables are often made from elastic, electrically insulating materials such as silicone rubber or EPDM, so that they can be expanded and pushed over, or shrunk down onto, a partly stripped cable end. At cable ends terminations are necessary to reduce the risk of electrical discharge between the power cable conductor and the end of the ground layer of the cable where the field lines tend to concentrate. After a termination has been installed on a cable end, conductive or semiconductive portions of the termination are in electrical contact with the cable ground layer and reduce the concentration of field lines by their shape and/or by the permittivity of their material. Many terminations have an earth layer connected to electrical ground via a grounding wire on the outside of the body of the termination. An example of an MV/HV cable termination is the 3M™ ColdShrink QT-III Termination from 3M Company, St. Paul, Minnesota, U.S.A.

In many terminations a conductive layer is in contact with the earth braid or ground layer of the power cable. The termination insulates the exposed cable power conductor against the ground layer of the cable.

It is generally advantageous to place the voltage sensor in the vicinity of the termination, because the space around the termination can be used. It is also generally advisable to electrically connect the voltage sensor close to the points where the termination is connected, so that both elements are subject to the same voltage difference. Therefore, in certain embodiments, the cable termination is mechanically and electrically connected to the busbar at a device connection position, wherein the voltage sensor is mechanically and electrically connected to the busbar at a sensor connection position, and wherein the geometric distance between device connection position and the sensor connection position is 20 centimetres or less. In certain preferred embodiments the geometric distance between the device connection position and the sensor connection position is 10 centimetres or less. In certain embodiments the device connection position and the sensor connection position on the busbar may be identical, resulting in a distance of zero.

The geometric distance is measured along a straight line point-to-point "as the crow flies".

It is advantageous for the voltage sensor to have an elongated shape, so that its high-voltage portion and its low-voltage portion can be arranged far from each other, minimizing the risk of electrical discharge. Where both the termination and the voltage sensor have an elongated shape, it may save space in a switchgear or other compartment to arrange these elements parallel to each other. Hence, in certain embodiments of the present disclosure the cable termination has an elongated shape defining a termination length direction, wherein the voltage sensor has an elongated shape defining a sensor length direction, and wherein the voltage sensor is connected to the busbar such that the voltage sensor is arranged next to the cable termination, and/or such that the sensor length direction is parallel to the termination length direction.

In order to make installation easier, the termination and the voltage sensor may use the same grounding element, e.g. in a switchgear or transformer, for ground connection. This may make the provision of a dedicated grounding element for the voltage sensor obsolete. Therefore, in certain embodiments, the assembly further comprises a grounding element of a switchgear or of a transformer, wherein the cable termination comprises a ground attachment means and is electrically and mechanically attached to the grounding element by the ground attachment means, and wherein the voltage sensor is electrically and mechanically attached to the same grounding element.

In this first aspect, the power conductor of the cable and the bus bar are on elevated voltage when in use, the cable termination insulates the elevated voltage against ground, and the voltage sensor is electrically installed between the elevated voltage of the bus bar and ground. In an alternative, second aspect, insulation of the busbar is provided by an insulating element, such as a standoff, that mechanically supports the busbar and insulates it from ground. Like in the first aspect, the voltage sensor is connected electrically parallel to the insulating element between elevated voltage and ground, and mechanically close to the insulating element. The sensor is separate from the insulating element and when voltage sensing becomes a necessity, the voltage sensor can be retrofitted parallel to an existing insulating element without replacing the existing insulating element by a new, sensorized insulating element.

In the second aspect, the present disclosure therefore provides an assembly of
a) a busbar, such as for use in a switchgear or transformer in a high-voltage or medium-voltage power network for distributing electrical power at an elevated voltage in a national grid;
b) an insulating element, such as a standoff, mechanically supporting the busbar and electrically insulating the busbar from electrical ground;
c) a voltage sensor, mechanically connected to the busbar and comprising a voltage divider, electrically connected between the busbar and electrical ground, for sensing the elevated voltage of the busbar, the voltage divider comprising
  i) a high-voltage portion comprising one or more discrete impedance elements, electrically serially connected with each other and electrically connected to the busbar,
  ii) a low-voltage portion comprising one or more discrete impedance elements, serially connected between the high-voltage portion and ground, and
  iii) a signal contact, electrically arranged between the high-voltage portion and the low-voltage portion, for providing a signal voltage indicative of the elevated voltage.

The term "standoff", as used herein, refers to a specific insulating element that mechanically supports a busbar, e.g. in a switchgear or in a transformer. The insulating properties and the length of the standoff allow the busbar, which is on elevated voltage when in use, to be installed on elements on low voltages or on electrical ground. A standoff is typically from, or comprises, porcelain, polymeric material or an epoxy resin. A standoff mostly has an elongated shape.

As noted above for terminations, it is generally advantageous to place the voltage sensor in the vicinity of the insulating element, because the space around the insulating element can be used. It is also generally advisable to electrically connect the voltage sensor close to the point where the insulating element is connected, so that both elements are subject to the same voltage difference. Therefore, in certain embodiments, the insulating element is mechanically and electrically connected to the busbar at a device connection position, wherein the voltage sensor is mechanically and electrically connected to the busbar at a sensor connection position, and wherein the geometric distance between device connection position and the sensor connection position is 20 centimetres or less. In certain preferred embodiments the geometric distance between the device connection position and the sensor connection position is 10 centimetres or less. In certain embodiments the device connection position and the sensor connection position on the busbar may be identical, resulting in a distance of zero.

As stated above, it is advantageous for the voltage sensor to have an elongated shape, so that its high-voltage portion and its low-voltage portion can be arranged far from each other, minimizing the risk of electrical discharge. Where both the insulating element and the voltage sensor have an elongated shape, it may save space to arrange these elements next to each other and/or parallel to each other. Hence, in certain embodiments of the present disclosure, the insulating element has an elongated shape defining an insulating element length direction, wherein the voltage sensor has an elongated shape defining a sensor length direction, and wherein the voltage sensor is connected to the busbar such that the voltage sensor is arranged next to the insulating element, and/or such that the sensor length direction is parallel to the insulating element length direction.

In a yet further, third aspect of the present disclosure, the same concept can be applied to a bushing in a MV/HV power network. Bushings conduct power through a grounded wall of a housing (e.g. of a transformer, a power plant, or a switchgear). A bushing comprises a power-conducting bolt and an insulating body which supports the bolt and insulates it against the grounded housing. When voltage sensing becomes a requirement at the location of the bushing, a traditional option is to replace the bushing with a bushing that has an integrated voltage sensor, i.e. a "sensorized" bushing. According to the third aspect of the present disclosure, this replacement can be avoided by connecting a voltage sensor between the bolt on elevated voltage and the electrical ground of the housing.

In its third aspect, the present disclosure therefore provides an assembly of
a) a bushing for use in a switchgear or a transformer in a high-voltage or medium-voltage power network for distributing electrical power at an elevated voltage in a national grid, the bushing comprising a power-conducting bolt on an elevated voltage when in use, and an insulating bushing body mechanically supporting the bolt and electrically insulating the bolt from electrical ground;

b) a voltage sensor, mechanically connected to the bolt and comprising a voltage divider, electrically connected between the bolt and electrical ground, for sensing the elevated voltage of the bolt, the voltage divider comprising
  i) a high-voltage portion comprising one or more discrete impedance elements, electrically serially connected with each other and electrically connected to the bolt,
  ii) a low-voltage portion comprising one or more discrete impedance elements, serially connected between the high-voltage portion and ground, and
  iii) a signal contact, electrically arranged between the high-voltage portion and the low-voltage portion, for providing a signal voltage indicative of the elevated voltage.

The term "bushing", as used herein, refers to an insulating device that allows an electrical conductor to pass through a grounded conducting barrier such as a wall of a housing of a transformer or switchgear. A bushing for MV/HV power networks or national grids comprises a conductive bolt for conducting electrical power at elevated voltages and tens of amperes. The bolt is insulated by an insulating bushing body of an electrically insulating material, such as porcelain, impregnated paper, or resin.

Where both the bushing and the voltage sensor have an elongated shape, it may save space to arrange these elements next to each other and/or parallel to each other. Hence, in certain embodiments of the present disclosure, the bushing has an elongated shape defining a bushing length direction, wherein the voltage sensor has an elongated shape defining a sensor length direction, and wherein the voltage sensor is connected to the bolt such that the voltage sensor is arranged next to the bushing, and/or such that the sensor length direction is parallel to the bushing length direction.

Traditionally, switchgears, transformers and other apparatus in power networks were provided with a voltage sensor by replacing an existing element, mostly an insulating element, with a similar element featuring an integrated voltage sensor. According to the present disclosure upgrading an electrical apparatus in a MV/HV power network can now be done by providing it with a voltage sensor in addition to the existing element, electrically connected in parallel to the existing (and remaining) element.

Hence, in a further aspect, the present disclosure also provides a process of enhancing an electrical apparatus in a high-voltage or medium voltage power network for distributing electrical power at an elevated voltage in a national grid, such as a switchgear or a transformer, wherein the electrical apparatus comprises a busbar on the elevated voltage to conduct the power, and wherein a power cable termination or a standoff is mechanically and electrically connected to the busbar, the process comprising the steps of a) providing a voltage sensor comprising a voltage divider for sensing the elevated voltage, the voltage divider comprising i) a high-voltage portion comprising one or more electrically serially connected discrete impedance elements, ii) a low-voltage portion comprising one or more discrete impedance elements, serially connected between the high-voltage portion and ground, and iii) a signal contact, electrically arranged between the high-voltage portion and the low-voltage portion, for providing a signal voltage indicative of the elevated voltage; and b) mechanically and electrically connecting the voltage sensor to the busbar and electrically connecting the voltage sensor between the busbar and electrical ground such that the high-voltage portion is electrically connected to the busbar and the low-voltage portion is serially connected between the high-voltage portion and ground.

The present disclosure relates to assemblies for use in medium-voltage ("MV") or high-voltage ("HV") power distribution networks in which electrical power is distributed via HV/MV cables, transformers, switchgears, substations etc. with currents of hundreds of amperes and voltages of tens of kilovolts. The term "medium voltage" or "MV" as used herein refers to an AC or DC voltage in the range of 1 kV to 72 kV, whereas the term "high voltage" or "HV" refers to an AC or DC voltage of more than 72 kV. Medium voltage and high voltage are collectively referred to herein as "elevated voltage".

Generally, in the context of the present disclosure, the term "impedance element" refers to a capacitor, a resistor, or an inductor. An impedance element, i.e. a capacitor, a resistor, or an inductor may be a discrete impedance element, i.e. a discrete capacitor, a discrete resistor, or a discrete inductor. As used herein, a discrete impedance element is an individual electrical element that exists independently from other electrical elements, from a printed circuit board ("PCB") or from conductive traces on a PCB. In particular, a discrete impedance element is not formed by conductive traces on an outer surface of a PCB, or in a PCB. A discrete impedance element may be, in particular, a surface mount discrete impedance element, i.e. one that can be mounted on an outer surface of a PCB.

In certain embodiments, each impedance element comprised in the high-voltage portion and/or in the low-voltage portion is a discrete, surface-mount impedance element. In certain of these embodiments, each impedance element comprised in the high-voltage portion and/or in the low-voltage portion is a discrete, surface-mount capacitor.

Discrete surface-mount capacitors of suitable capacitances in the nanofarad and picofarad range are commercially available at high nominal precision ratings and are therefore useful in voltage dividers usable in assemblies according to the present disclosure. Also, discrete surface-mount capacitors can be replaced easily. The voltage drop across each impedance element in a chain of serially connected impedance elements is smaller, if the elevated voltage is divided down by a larger number of impedance elements, as opposed to by fewer impedance elements. The requirements for the voltage withstand of the individual discrete impedance elements of the respective chain can thus be lower. Hence, in certain embodiments of the present disclosure, the voltage divider comprises more than ten, in other embodiments more than twenty, discrete impedance elements.

In certain embodiments of an assembly according to the first, second or third aspect of the present disclosure, at least two of the discrete impedance elements of the voltage divider are embedded in a rigid, electrically insulating encapsulation body comprising a hardened resin. The resin may contact a surface of each of the embedded impedance elements. The encapsulation body may help protect the embedded discrete impedance against environmental impacts. An encapsulation body of a suitable material of high dielectric strength may help avoid electrical discharges between elements of the voltage sensor on elevated voltage and other elements on a low voltage or on ground and between two discrete impedance elements.

In certain embodiments, an assembly as described above further comprises a shielding layer for shielding at least two of the discrete impedance elements embedded in the encapsulation body, wherein the shielding layer is arranged on at least a portion of an outer surface of the encapsulation body such as to surround the at least two discrete impedance elements. A shielding layer may help improve the accuracy of the voltage sensing by reducing parasitic capacities. A shielding layer may be electrically connected to the elevated voltage, to a low voltage of below 100 Volt, or to electrical ground. The assembly may comprise two shielding layers. Two shielding layers may be arranged side by side on respective portions of the outer surface of the encapsulation body. Where an encapsulation body of a voltage sensor of an assembly comprises two shielding layers, arranged side by side on respective portions of the outer surface of the encapsulation body, one of the shielding layers may be connected to electrical ground, and the other one of the shielding layers may be connected to the elevated voltage.

Where the voltage sensor comprises an encapsulation body as described above, the assembly may further comprise a tubular, elastically deformable insulating sleeve, wherein the sleeve surrounds the encapsulation body, and optionally is in surface contact with the encapsulation body. The insulating sleeve provides additional electrical insulation of the voltage sensor, at least of the voltage divider. This may help reduce the risk of electrical discharges between the voltage divider and its components and an element on ground or on elevated voltage.

In certain embodiments, the elastically deformable insulating sleeve is a shrinkable sleeve, e.g. of a silicone rubber or EPDM, that can be shrunk over the encapsulation body. The shrinkable sleeve may be a cold-shrinkable sleeve or a heat-shrinkable sleeve.

In certain other embodiments, the elastically deformable insulating sleeve is an expandable sleeve that can be pushed over the encapsulation body. Shrinkable or expandable sleeves are particularly easy to apply over the encapsulation body.

The insulating sleeve may comprise skirts to provide for a longer path for parasitic currents along its surface. This may help to minimize losses and provide for more accurate voltage sensing.

In certain embodiments, the insulating sleeve comprises electrically conductive or semi-conductive stress control elements for contacting the encapsulation body or the shielding layer. Such stress control elements may help reduce the risk of electrical discharges at edges of conductive elements in the encapsulation body or at an edge of a shielding layer.

The stress control elements may be integrally formed, e.g. co-molded, with other portions of the insulating sleeve. The stress control elements may be formed from conductive or semi-conductive silicone rubber. The stress control elements may be arranged such as to form an inner surface of the insulating sleeve. This may allow the stress control elements to be in reliable surface contact with a surface of the encapsulation body or with a shielding layer on an outer surface of the encapsulation body.

In a further aspect, the present disclosure provides an electrical apparatus, such as a switchgear or a transformer, in a high-voltage or medium-voltage power network for distributing electrical power at an elevated voltage in a national grid, the apparatus comprising an assembly as described herein.

Exemplary particular embodiments of assemblies according to the present disclosure will now be described in more detail with reference to the following Figures.

Figure 1:
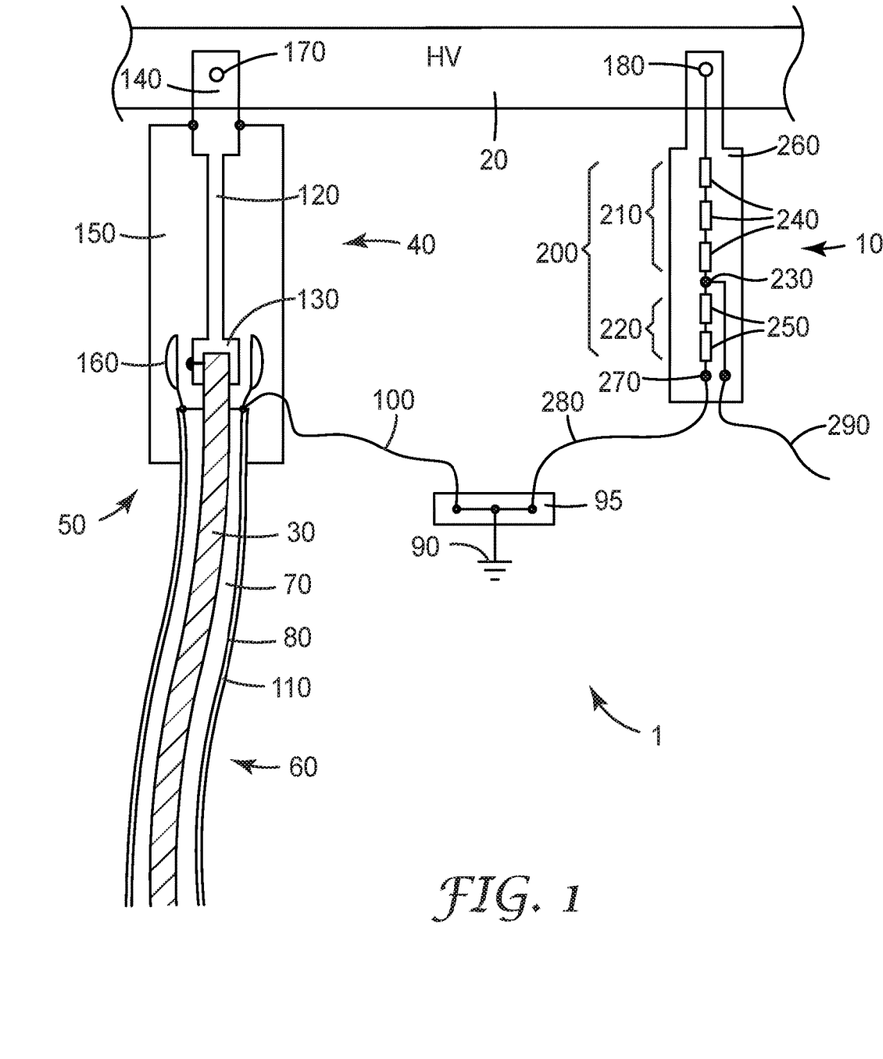
FIG. 1 Sectional view/circuit diagram of a first assembly according to the present disclosure.

FIG. 1 illustrates in a combined sectional view and a circuit diagram a first assembly 1 according to the present disclosure. The assembly 1 comprises a busbar 20 in a MV/HV electrical switchgear (not shown), a cable termination 40 on an end portion 50 of a high-voltage (HV) power cable 60, and a voltage sensor 10.

The cable 60 has a central power conductor 30 which is surrounded by a main insulation layer 70, on which a grounding layer 80 is arranged which is connected to electrical ground 90 at a grounding element 95 by a grounding wire 100 and covered by a cable sheath 110. The cable 60 is mechanically and electrically connected to the busbar 20 via the cable termination 40, which in turn comprises a conductive element 120 having at one end a connector 130 to engage the central conductor 30, and at the opposite end a lug 140 for connection to the busbar 20 at a device connection position 170 of the busbar 20. The conductive element 120 is embedded in an insulation body 150 of a non-conductive silicone rubber material. For electrical stress control, the termination 40 features a semi-conductive stress control element 160 which is electrically connected to the grounding layer 80 of the cable 60 and reduces, by its shape and conductivity, the concentration of electrical field lines at the end of the grounding layer 80, thereby reducing the risk of electrical breakdown.

In use, the busbar 20 is on the elevated voltage of the cable conductor 30. In order to measure the elevated voltage, traditionally the termination 40 would have been replaced by a sensorized termination having an integrated voltage sensor. To avoid the effort and cost of such a replacement, the termination 40 is left unchanged, and the voltage sensor 10 is mechanically connected to the busbar 20 in the vicinity of the termination 40 at a sensor connection position 180 of the busbar 20. The voltage sensor 10 is thus electrically connected in parallel to the termination 40.

The voltage sensor 10 comprises a resistive voltage divider 200, electrically connected between the busbar 20 and ground 90, for sensing the elevated voltage of the busbar 20. The voltage divider 200 has a high-voltage portion 210, a low-voltage portion 220 and a signal contact 230 between the high-voltage portion 210 and the low-voltage portion 220 at which a divided voltage can be picked up. This divided voltage is a signal voltage which varies proportionally with the elevated voltage of the busbar 20. The proportionality factor between the elevated voltage and the signal voltage is the ratio of the impedance of the low-voltage portion 220 to the impedance of the entire voltage divider 200. It may be also referred to as the "dividing ratio". The signal voltage is made available outside the voltage sensor 10 via a signal wire 290, which may be connected to a processing unit for determining the elevated voltage from the signal voltage and the dividing ratio.

As FIG. 1 indicates, the high-voltage portion 210 comprises three discrete high-voltage resistors 240, electrically connected in series. The low-voltage portion 220 comprises two discrete low-voltage resistors 250, electrically connected in series with each other. The discrete resistors 240, 250 are arranged geometrically in a straight row on a circuit board 260. The high-voltage resistors 240 are electrically connected between the busbar 20 and the low-voltage portion 220, and the low-voltage resistors 250 are electrically connected between the high-voltage portion 210 and a grounding contact 270, electrically connected to ground 90 by a sensor grounding wire 280.

It is contemplated that the voltage divider 200 could alternatively be a capacitive voltage divider, in which the high-voltage portion 210 comprises one or more discrete high-voltage capacitors, electrically connected in series instead of the discrete high-voltage resistors 240. Similarly, the low-voltage portion 220 would comprise one or more discrete low-voltage capacitors, electrically connected in series with each other, instead of the discrete low-voltage resistors 250. The discrete capacitors can be arranged geometrically in a straight row on a circuit board. The high-voltage capacitors may be electrically connected between the busbar 20 and the low-voltage portion 220, and the low-voltage capacitors may be electrically connected between the high-voltage portion 210 and a grounding contact 270. A voltage sensor 10 comprising capacitors instead of resistors would be usable for sensing alternating (AC) elevated voltages of the busbar 20 and the cable conductor 30, while a voltage sensor 10 comprising resistors would be usable for sensing both AC and DC voltages.

Figure 2:
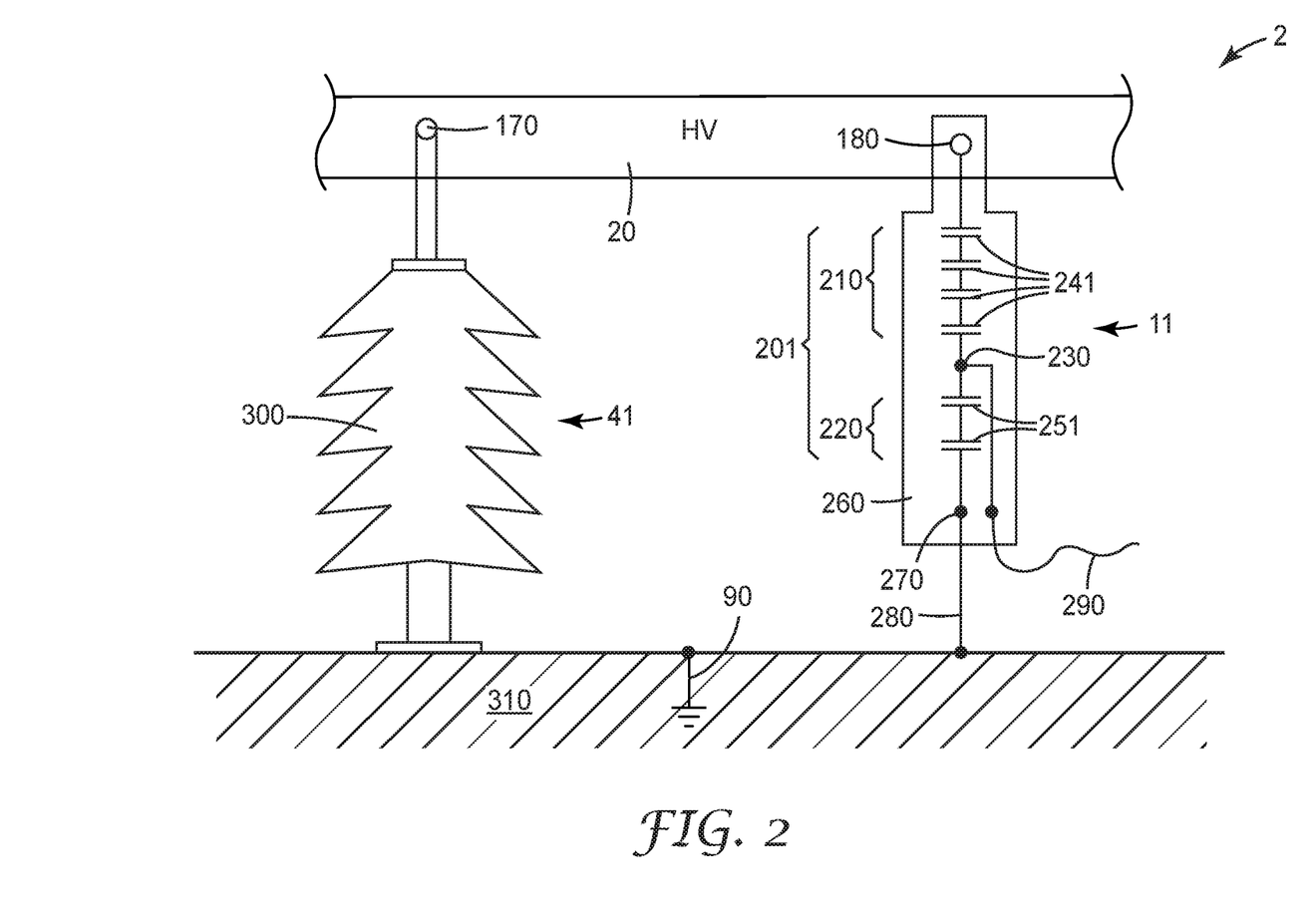
FIG. 2 Sectional view/circuit diagram of a second assembly according to the present disclosure.

FIG. 2 illustrates in a combined sectional view and a circuit diagram a second assembly 2 according to the present disclosure. The assembly 2 comprises a busbar 20 in a MV/HV electrical switchgear (not shown), an insulating standoff 41 and a voltage sensor 11. The standoff 41 mechanically supports the busbar 20 and comprises a rigid insulating body 300 that is mechanically connected to the busbar 20 at a device connection position 170 of the busbar. At its other end, the standoff 41 is supported by a bottom element 310 of the switchgear, held on electrical ground 90.

In use, the busbar 20 is on an elevated voltage. In order to measure the elevated voltage, traditionally the standoff 41 would have been replaced by a sensorized standoff having an integrated voltage sensor. To avoid the effort and cost of such a replacement, the standoff 41 is left unchanged, and the voltage sensor 11 is mechanically connected to the busbar 20 in the vicinity of the standoff 41 at a sensor connection position 180 of the busbar 20. The voltage sensor 11 is thus electrically connected in parallel to the standoff 41.

The voltage sensor 11 comprises a capacitive voltage divider 201, electrically connected between the busbar 20 and ground 90, for sensing the elevated voltage of the busbar 20. The voltage divider 201 has a high-voltage portion 210, a low-voltage portion 220 and a signal contact 230 between the high-voltage portion 210 and the low-voltage portion 220 at which a divided voltage can be picked up, as described above for the resistive voltage divider 10 of FIG. 1.

As FIG. 2 indicates, the high-voltage portion 210 comprises four discrete high-voltage capacitors 241, electrically connected in series. The low-voltage portion 220 comprises two discrete low-voltage capacitors 251, electrically connected in series with each other. The discrete capacitors 241, 251 are arranged geometrically in a straight row on a circuit board 260. The high-voltage capacitors 241 are electrically connected between the busbar 20 and the low-voltage portion 220, and the low-voltage capacitors 251 are electrically connected between the high-voltage portion 210 and a grounding contact 270, electrically connected to ground 90 by a sensor grounding wire 280.

Figure 3:
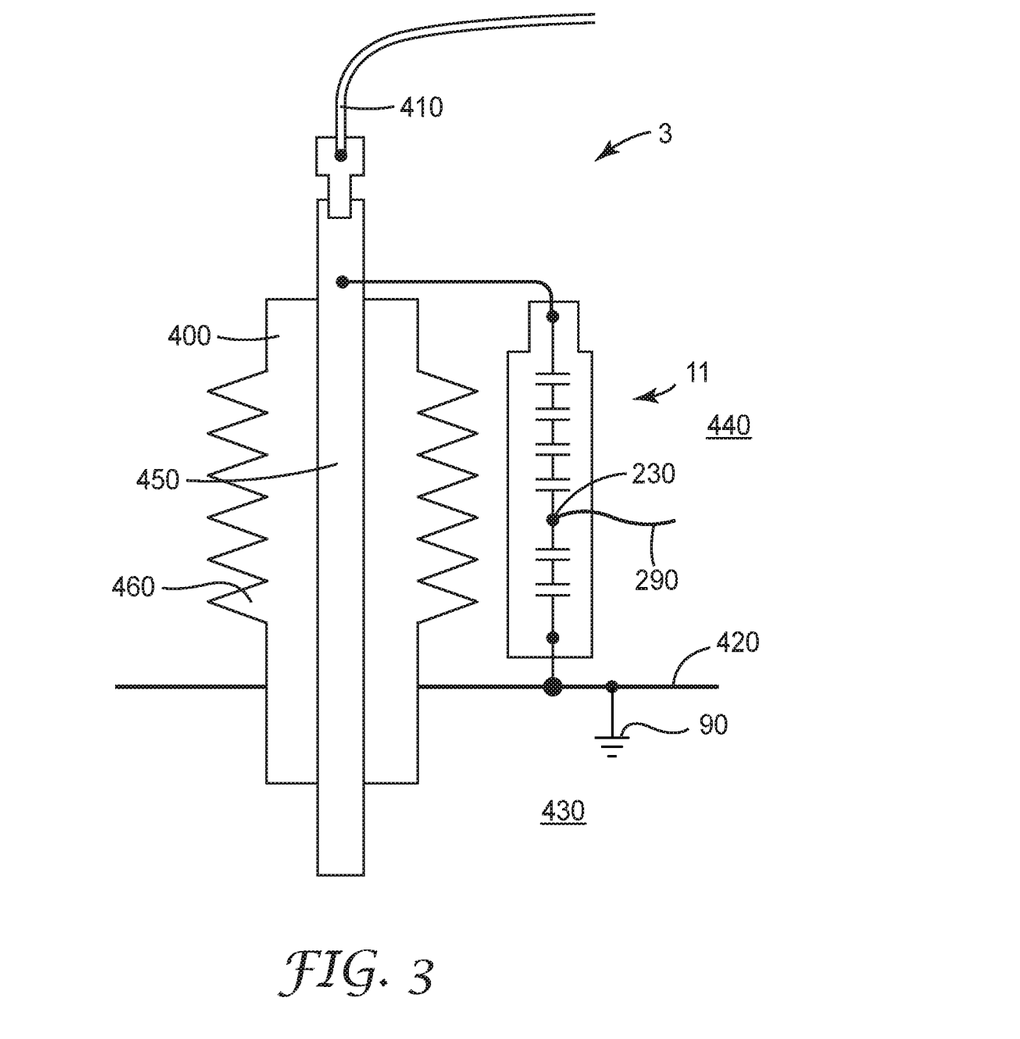
FIG. 3 Sectional view/circuit diagram of a third assembly according to the present disclosure.

As illustrated in the sectional view, combined with circuit diagram, of FIG. 3 the present disclosure can be applied also for bushings. A third assembly 3 according to the present disclosure is depicted. A regular bushing 400 facilitates entry of a power conductor 410 on elevated voltage in a HV/MV power network through a grounded housing wall 420 from an outside 440 to an inside 430 of an electrical apparatus, e.g. a switchgear or a transformer. The bushing 400 comprises a power-conducting bolt 450 and an insulating body 460 which supports the bolt 450 and insulates it from the housing 420 on electrical ground 90. A voltage sensor 11, similar to the one shown in FIG. 2, is connected to the bolt 450 on elevated voltage for sensing the voltage of the bolt 450. Specifically, its high-voltage portion 210 is connected to the bolt 450, and its low-voltage portion 220 is connected between the high-voltage-portion 210 and the housing wall 420 on electrical ground 90. A signal wire 290 is connected to the signal contact 230 to make the divided voltage, the "signal voltage", available outside the voltage sensor 11.

Figure 4:
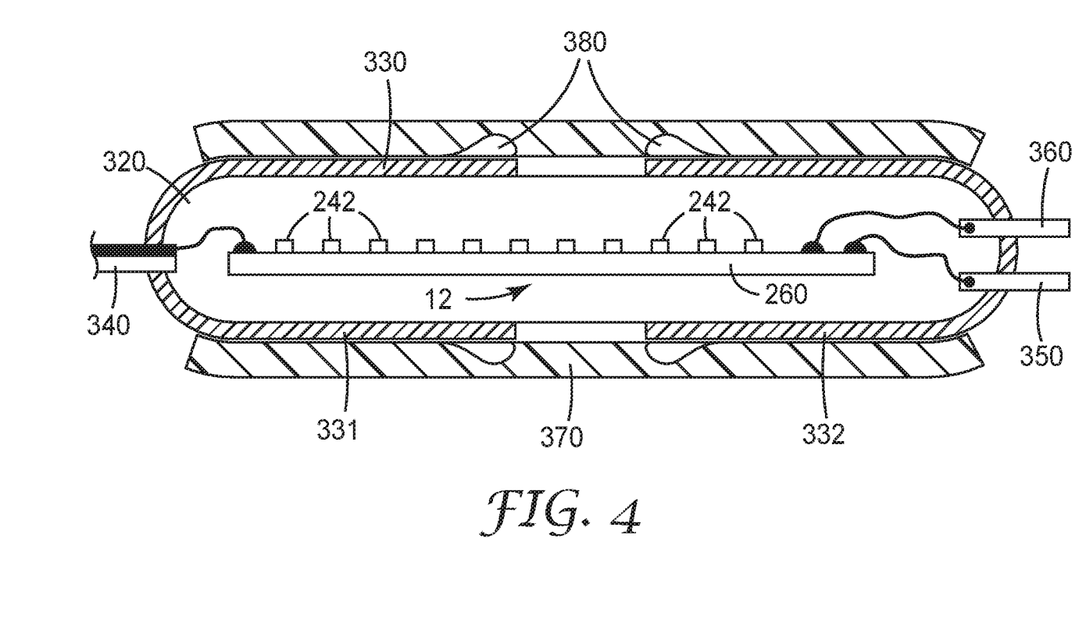
FIG. 4 Sectional view of a voltage sensor of an assembly according to the present disclosure, comprising an encapsulation body, a shielding layer and an insulating sleeve.

FIG. 4 illustrates, in a sectional view, a voltage sensor 12 embedded in a rigid, electrically insulating encapsulation body 320. The encapsulation body 320 is made of an epoxy resin which is cast in liquid form around the discrete impedance elements 242 of the voltage divider and the circuit board 260 on which the impedance elements 242 are supported and is then let dry and harden to form the rigid encapsulation body 320. For sensing the elevated voltage, the voltage divider is connected to a busbar 20 on elevated voltage via a high-voltage contact 340 and to ground via a low-voltage contact 350. A signal tab 360 makes the signal voltage available outside of the encapsulation body 320.

The outer surface of the encapsulation body 320 is equipped with a split shielding 330 to reduce parasitic currents. The split shielding 330 comprises two conductive shielding layers 331, 332, arranged side by side on respective portions of the outer surface of the encapsulation body 320. Each of these layers 331, 332 surrounds a number of discrete impedance elements 242 of the voltage divider.

The first, left-hand shielding layer 331 is connected to the elevated voltage, while the second, right-hand shielding layer 332 is held on electrical ground. This minimizes parasitic currents from the impedance elements 242, which may reduce the accuracy of the voltage measurement.

The voltage sensor 12 in its encapsulation body 320 is accommodated in a tubular, elastically deformable insulating sleeve 370, made of a non-conductive silicone rubber material. The sleeve 370 surrounds the encapsulation body 320 and the voltage sensor 12. The sleeve 370 is a shrinkable sleeve 370, which was held in an expanded state to receive the encapsulation body 320 encapsulating the voltage sensor 12 and was then shrunk down on the encapsulation body 320. After shrinking, the sleeve 370 is in tight surface contact with the outer surface of the encapsulation body 320 and the shielding 330. The sleeve 370 comprises semiconductive stress control elements 380 which contact the shielding layers 331, 332 at their respective edges to avoid a high concentration of field lines at the edges and reduce the risk of electrical discharge at those edges.

The invention claimed is:

1. An assembly having a busbar, for use in a switchgear or transformer in a high-voltage or medium-voltage power network for distributing electrical power in a national grid, comprising:

a cable termination, arranged on an end portion of a high-voltage or medium-voltage power cable for distributing electrical power, the cable termination insulating a section of the end portion, wherein a power conductor of the power cable is mechanically and electrically connected to the busbar via the cable termination, and a voltage sensor, mechanically connected to the busbar and comprising a voltage divider, electrically connected between the busbar and electrical ground, for sensing the voltage of the bus bar, wherein the voltage divider comprises
- a high-voltage portion comprising one or more discrete impedance elements, electrically serially connected with each other and electrically connected to the busbar,
- a low-voltage portion comprising one or more discrete impedance elements, serially connected between the high-voltage portion and ground, and
- a signal contact, electrically arranged between the high-voltage portion and the low-voltage portion, for providing a signal voltage indicative of the voltage, and wherein the cable termination has an elongated shape defining a termination length direction, wherein the voltage sensor has an elongated shape defining a sensor length direction, and wherein the voltage sensor is connected to the busbar such that the voltage sensor is arranged next to the cable termination, such that the sensor length direction is parallel to the termination length direction.

2. Assembly according to claim 1, wherein the cable termination is mechanically and electrically connected to the busbar at a device connection position, wherein the voltage sensor is mechanically and electrically connected to the busbar at a sensor connection position, and wherein the geometric distance between device connection position and the sensor connection position is 20 cm or less.

3. Assembly according to claim 1, further comprising a grounding element of the switchgear or of the transformer, wherein the cable termination comprises a ground attachment means and is electrically and mechanically attached to the grounding element by the ground attachment means, and wherein the voltage sensor is electrically and mechanically attached to the same grounding element.

4. An electrical apparatus comprising the switchgear or the transformer, in a high-voltage or medium-voltage power network for distributing electrical power in the national grid, the apparatus comprising the assembly according to claim 1.

5. A process of enhancing an electrical apparatus in a high-voltage or medium voltage power network for distributing electrical power in a national grid, such as a switchgear or a transformer, wherein the electrical apparatus comprises a busbar to conduct the power, and wherein a power cable termination is mechanically and electrically connected to the busbar, wherein the power cable termination has an elongated shape defining a termination length direction, the process comprising the steps of
a) providing a voltage sensor comprising a voltage divider for sensing a voltage, the voltage divider comprising
   i) a high-voltage portion comprising one or more electrically serially connected discrete impedance elements,
   ii) a low-voltage portion comprising one or more discrete impedance elements, serially connected between the high-voltage portion and ground, and
   iii) a signal contact, electrically arranged between the high-voltage portion and the low-voltage portion, for providing a signal voltage indicative of the voltage; and
b) mechanically and electrically connecting the voltage sensor to the busbar and electrically connecting the voltage sensor between the busbar and electrical ground such that the high-voltage portion is electrically connected to the busbar and the low-voltage portion is serially connected between the high-voltage portion and ground, wherein the voltage sensor has an elongated shape defining a sensor length direction, and wherein the voltage sensor is connected to the busbar such that the voltage sensor is arranged next to the power cable termination, such that the sensor length direction is parallel to the termination length direction.

* * * * *